(12) United States Patent
Hotta et al.

(10) Patent No.: US 10,014,451 B2
(45) Date of Patent: Jul. 3, 2018

(54) METHOD FOR PRODUCING SEMICONDUCTOR LIGHT-EMITTING DEVICE

(71) Applicant: Sumitomo Chemical Company, Limited, Tokyo (JP)

(72) Inventors: Shohei Hotta, Osaka (JP); Masayuki Takashima, Osaka (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 0 days.

(21) Appl. No.: 15/118,912

(22) PCT Filed: Feb. 6, 2015

(86) PCT No.: PCT/JP2015/054051
§ 371 (c)(1),
(2) Date: Aug. 15, 2016

(87) PCT Pub. No.: WO2015/125713
PCT Pub. Date: Aug. 27, 2015

(65) Prior Publication Data
US 2016/0359092 A1    Dec. 8, 2016

(30) Foreign Application Priority Data

Feb. 18, 2014  (JP) ................................ 2014-028203
Feb. 18, 2014  (JP) ................................ 2014-028204

(51) Int. Cl.
*H01L 33/56*    (2010.01)
*H01L 33/62*    (2010.01)

(52) U.S. Cl.
CPC .............. *H01L 33/56* (2013.01); *H01L 33/62* (2013.01); *H01L 2224/16225* (2013.01);
(Continued)

(58) Field of Classification Search
CPC ..................... H01L 33/56; H01L 33/62; H01L 2224/45144; H01L 2224/48237;
(Continued)

(56) References Cited

U.S. PATENT DOCUMENTS

2007/0032609 A1    2/2007   Barfurth et al.
2008/0224608 A1    9/2008   Konishi et al.
(Continued)

FOREIGN PATENT DOCUMENTS

CN    101266968 A    9/2008
CN    101379163 A    3/2009
(Continued)

OTHER PUBLICATIONS

Int'l Search Report dated Apr. 7, 2015 in Int'l Application No. PCT/JP2015/054051 (English Translation).
(Continued)

*Primary Examiner* — Selim Ahmed
(74) *Attorney, Agent, or Firm* — Panitch Schwarze Belisario & Nadel LLP (57) ABSTRACT

A method for producing a semiconductor light-emitting device containing a substrate, an element and an encapsulating material as constituent members is provided. The method involves providing the substrate with the element; potting at least one encapsulating material (i) before curing selected from addition polymerization-type encapsulating materials and polycondensation-type encapsulating materials onto the substrate to cover the element; curing the potted encapsulating material (i); potting a polycondensation-type encapsulating material (ii) before curing onto the encapsulating material (i) after curing which covers the element, and then curing the potted polycondensation-type encapsulating material (ii), thereby laminating the encapsulating material. A semiconductor light-emitting device produced by the
(Continued)

method is also provided, in which two or more layers each containing the encapsulating material are laminated.

13 Claims, 1 Drawing Sheet

(52) U.S. Cl.
CPC ............... *H01L 2224/45144* (2013.01); *H01L 2224/48091* (2013.01); *H01L 2224/48227* (2013.01); *H01L 2224/48237* (2013.01); *H01L 2924/181* (2013.01); *H01L 2933/005* (2013.01)

(58) Field of Classification Search
CPC . H01L 2224/48227; H01L 2224/48091; H01L 2224/16225; H01L 2924/181; H01L 2933/005
See application file for complete search history.

(56) References Cited

U.S. PATENT DOCUMENTS

| | | |
|---|---|---|
| 2009/0008673 A1 | 1/2009 | Kato et al. |
| 2009/0033201 A1 | 2/2009 | Shimooka et al. |
| 2009/0065791 A1* | 3/2009 | Yen ........................ H01L 33/507 257/98 |

FOREIGN PATENT DOCUMENTS

| | | |
|---|---|---|
| CN | 103122149 A | 5/2013 |
| EP | 1985683 A1 | 10/2008 |
| JP | 2006507375 A | 3/2006 |
| JP | 2007035885 A | 2/2007 |
| JP | 2007112975 A | 5/2007 |
| JP | 2011132299 A | 7/2011 |
| JP | 2013065877 A | 4/2013 |

OTHER PUBLICATIONS

Int'l Preliminary Report on Patentability dated Aug. 23, 2016 in Int'l Application No. PCT/JP2015/054051 (English Translation).
Extended Search Report dated Jun. 9, 2017 in EP Application No. 15751586.7.
Office Action dated Dec. 1, 2017 in CN Application No. 201580008403.3.
Office Action dated Feb. 6, 2018 in TW Application No. 104104577.

* cited by examiner

METHOD FOR PRODUCING SEMICONDUCTOR LIGHT-EMITTING DEVICE

CROSS-REFERENCE TO RELATED APPLICATION

This application is a Section 371 of International Application No. PCT/JP2015/054051, filed Feb. 6, 2015, which was published in the Japanese language on Aug. 27, 2015 under International Publication No. WO 2015/125713 A1, and the disclosure of which is incorporated herein by reference.

TECHNICAL FIELD

The present invention relates to a method for producing a semiconductor light-emitting device.

BACKGROUND ART

As a method for producing a semiconductor light-emitting device, there is known, for example, a producing method comprising a step of providing a substrate with an element, a step of potting a polycondensation-type encapsulating material before curing onto the substrate to cover the element, and a step of curing the potted polycondensation-type encapsulating material before curing (Patent Document 1, Non-Patent Document 1).

PRIOR ART DOCUMENT

Patent Document

Patent Document 1: JPA 2007-112975

Non-Patent Document

Non-Patent document 1: Azmax Co., Ltd. home page "Polysilsesquioxane•T-Resin"
<URL: http://www.azmax.co.jp/cnt_catalog_chemical/pdf/attach_2011 0517_135825.pdf>

DISCLOSURE OF THE INVENTION

Problems to be Solved by the Invention

However, the semiconductor light-emitting device produced by such a method was not necessarily satisfactory in terms of thermal shock resistance.

Means for Solving the Problems

The present invention includes the following inventions [1] to [13].
[1] A method for producing a semiconductor light-emitting device comprising a substrate, an element and an encapsulating material as constituent members, comprising
  a first step of providing the substrate with the element;
  a second step of potting at least one encapsulating material (i) before curing selected from the group consisting of addition polymerization-type encapsulating materials and polycondensation-type encapsulating materials onto the substrate to cover the element;
  a third step of curing the potted encapsulating material (i) before curing; and
  a fourth step of potting a polycondensation-type encapsulating material (ii) before curing onto the encapsulating material (i) after curing which covers the element, and then curing the potted polycondensation-type encapsulating material (ii) before curing, thereby laminating the encapsulating material;
[2] The producing method according to the above-mentioned [1], wherein the encapsulating material (i) is an addition polymerization-type encapsulating material;
[3] The producing method according to the above-mentioned [1], wherein the encapsulating material (i) is a polycondensation-type encapsulating material;
[4] The producing method according to the above-mentioned [3], wherein the encapsulating material (i) before curing to be used in the second step is a polycondensation-type encapsulating material comprising a resin X having a dialkyl siloxane structure represented by the formula (1):

in the formula (1), $R^3$ each independently represents an alkyl group, and n represents an integer of 5 to 4000;
[5] The producing method according to the above-mentioned [4], wherein n is an integer of 5 to 1000;
[6] The producing method according to any one of the above-mentioned [1] to [5], wherein the polycondensation-type encapsulating material (ii) before curing to be used in the fourth step comprises a resin A having an organopolysiloxane structure represented by the formula (2):

in the formula (2), $R^1$ each independently represents an alkyl group, $R^2$ each independently represents an alkoxy group or a hydroxyl group, and $p^1$, $q^1$, $a^1$ and $b^1$ represent positive numbers satisfying $[p^1+b^1 \times q^1]:[a^1 \times q^1]=1:0.25$ to 9;
[7] The producing method according to any one of the above-mentioned [1] to [6], wherein the fourth step is a step of laminating a polycondensation-type encapsulating material (ii) after curing which has a physical property different from that of the encapsulating material (i) after curing obtained in the third step;
[8] The producing method according to the above-mentioned [7], wherein the physical property is a physical property that stress applied to the polycondensation-type encapsulating material (ii) after curing laminated in the fourth step is relaxed by the encapsulating material (i) after curing obtained in the third step;

[9] The producing method according to the above-mentioned [8], wherein the encapsulating material (i) after curing obtained in the third step has a higher stress relaxation property than the polycondensation-type encapsulating material (ii) after curing laminated in the fourth step;

[10] The producing method according to any one of the above-mentioned [1] to [9], wherein the encapsulating material. (i) after curing obtained in the third step has adhesion with the polycondensation-type encapsulating material (ii) after curing laminated in the fourth step;

[11] The producing method according to any one of the above-mentioned [1] to [10], wherein the semiconductor light-emitting device is an ultraviolet LED;

[12] The producing method according to any one of the above-mentioned [1] to [11], characterized by repeating the fourth step, thereby producing a semiconductor light-emitting device in which three or more layers each comprising the encapsulating material are laminated;

[13] A semiconductor light-emitting device produced by the producing method according to any one of the above-mentioned [1] to [12], wherein two or more layers each comprising the encapsulating material are laminated.

EFFECT OF THE INVENTION

A semiconductor light-emitting device produced by the producing method of the present invention is excellent in thermal shock resistance.

MODE FOR CARRYING OUT THE INVENTION

The present invention will be described below in detail. Incidentally, the semiconductor light-emitting device of the present invention is excellent in thermal shock resistance, in that when the semiconductor light-emitting device is exposed to the environment of rapid temperature change, for example, it is less likely for cracks in the encapsulating material to occur, or for peeling between the encapsulating material and the substrate interface to occur.

The semiconductor light-emitting device produced by the producing method of the present invention comprises a substrate, an element and an encapsulating material as constituent members.

<Substrate>

Figure 1:
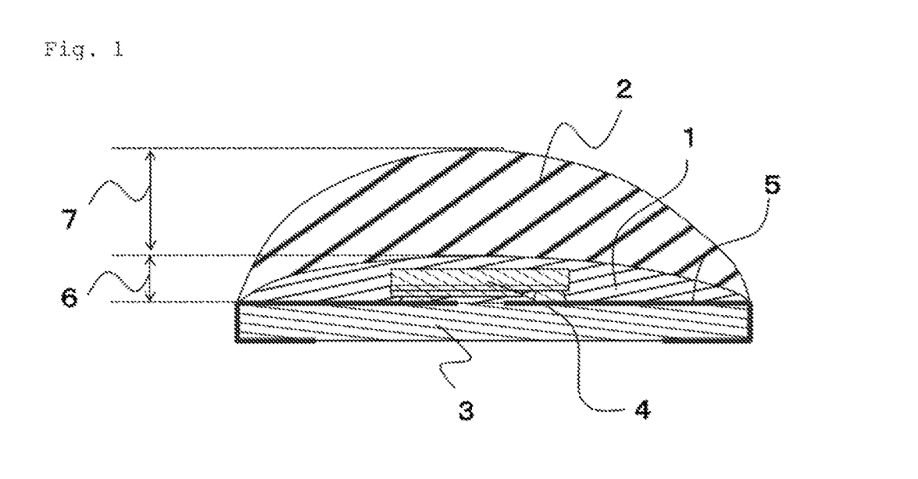
FIG. 1 is a model view of a flip-chip type and COB type semiconductor light-emitting device produced by the producing method of the present invention.
Figure 2:
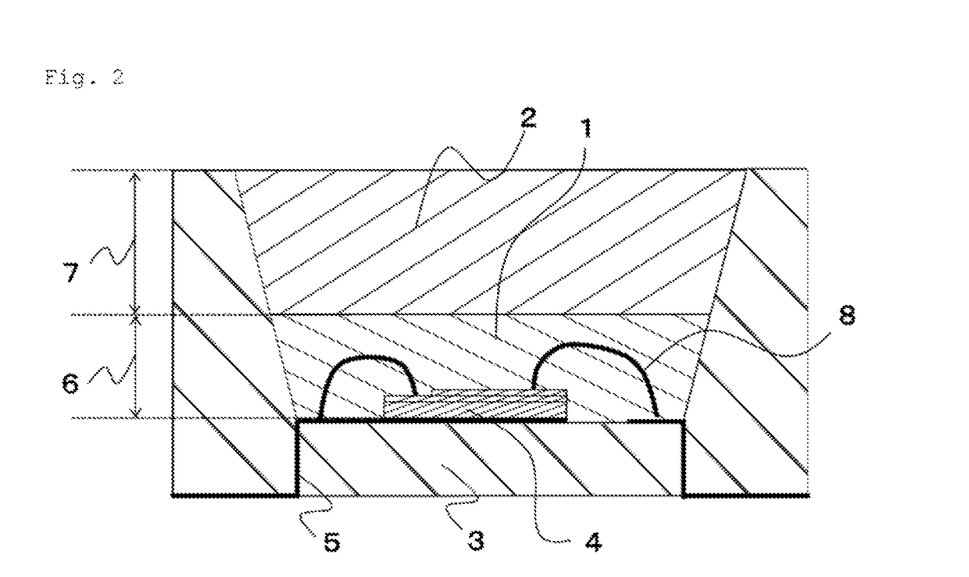
FIG. 2 is a model view of a face-up type and SMD type semiconductor light-emitting device produced by the producing method of the present invention.

The substrate only needs to be one which is generally used as a substrate of a semiconductor light-emitting device. For example, a substrate made of a resin such as nylon, epoxy or LCP, or made of a ceramic such as alumina, aluminum nitride or LTCC is used as the substrate. As the shape thereof, a configuration in which the element 4 is placed on the flat-plane substrate 3 made of a material such as a ceramic as shown in FIG. 1 and a configuration in which the reflector 5 is further placed in order to enhance the light extraction efficiency as shown in FIG. 2 are used.

Typically, an electrode is placed on the substrate in order to establish electrical connection to the element which is to be mounted.

<Element>

The element only needs to be one which is generally used as a semiconductor light-emitting element. The element includes, for example, a blue light-emitting diode, a red light-emitting diode, a green light-emitting diode, a white light-emitting diode and an ultraviolet light-emitting diode which are generally referred to as LEDs. These LEDs are produced, for example, by growing a group III-V semiconductor such as AlInGaP, InGaN or AlGaN on sapphire, aluminum nitride or the like by MOCVD method, HVPE method or the like. One or a plurality of elements are placed on one substrate. For the placement of the element, a flip-chip type in which the MOCVD growth surface is let to face the substrate side or a face-up type in which the MOCVD growth surface is let to face in the reverse direction is used. In the case of flip-chip method, the element is electrically connected to the electrode on the substrate by a solder. In the case of face-up method, the element is connected by using a wire interconnect such as gold. In the case of an ultraviolet LED, the flip-chip method is often used in view of light extraction.

<Encapsulating Material>

In the present invention, as the encapsulating material, at least one encapsulating material (i) selected from the group consisting of addition polymerization-type encapsulating materials and polycondensation-type encapsulating materials, and the polycondensation-type encapsulating material (ii) are used in a step-wise combination. The addition polymerization-type encapsulating material is an encapsulating material which polymerizes by the addition reaction of a hydrosilyl group and a carbon-carbon double bond. The polycondensation-type encapsulating material is an encapsulating material in which the polycondensation of a hydroxyl group bonded to a silicon atom, and an alkoxy group or a hydroxyl group bonded to a different silicon atom is accompanied with dealcoholization or dehydration. The polycondensation-type encapsulating material, for example, includes an encapsulating material comprising a polysiloxane described in "Electronics silicone Catalog" from Dow Corning Toray Co. Ltd. in the October 2010 issue and the like. There are dual-type encapsulating materials which polymerize by reaction in which addition polymerization and polycondensation take place simultaneously, however, the dual-type encapsulating materials are treated as addition polymerization-type encapsulating materials in the present invention.

The encapsulating material used in the second step of the present invention is an encapsulating material (i), and the encapsulating material used in the fourth step is a polycondensation-type encapsulating material (ii). As described later, it is preferable that the physical properties of the encapsulating material (i) after curing and the polycondensation-type encapsulating material (ii) after curing are different. It is more preferable that such a physical property is a physical property that stress applied to the polycondensation-type encapsulating material (ii) after curing is relaxed by the encapsulating material (i) after curing. Such preferable encapsulating material (i) and polycondensation-type encapsulating material (ii) are described below.

<Encapsulating Material (i)>

Of the encapsulating material (i), the addition polymerization-type encapsulating material includes, for example, a methyl silicone resin encapsulating material, a phenyl silicone resin encapsulating material and a methylphenyl silicone resin encapsulating material, and among them, the methyl silicone resin encapsulating material is preferable because the resin hardness after curing is relatively soft.

As these addition polymerization encapsulating materials, encapsulating materials which are generally commercially available can be used. Specifically, the encapsulating materials include OE-6250, OE-6336, OE-6301 and OE-6351 as methyl-based silicone resin encapsulating materials manufactured by Dow Corning Toray Co. Ltd., OE-6450, OE-6520, OE-6550, OE-6631, OE-6636, OE-6635, OE-6630 and OE-6665N as phenyl-based or methyl phenyl-based silicone resin encapsulating materials manufactured by the same company, IVS4321, XE14-C2042, IVS4542, IVS4546, IVS4622, IVS4632, IVS4742, IVS4752, IVSG3445, IVSG5778 and IVSG0810 as methyl-based silicone resins manufactured by Shin-Etsu chemical Co. Ltd., XE14-C2860 and XE14-C3450 as phenyl-based or methyl phenyl-based silicone resin encapsulating materials manufactured by the same company, KER-6020, KER-6150, KER-6075, KER-2700, KER-2600, KER-2500, KER-2450, KER-2400 and KER-2300 as methyl-based silicone resin encapsulating materials manufactured by Shin-Etsu chemical Co. Ltd., and SCR-1011, SCR-1012, SCR-1016, ASP-1111, ASP-1120, ASP-1031, ASP-1040, KER-6150, KER-6075 and KER-6100 as phenyl-based or methyl phenyl-based silicone resins manufactured by the same company.

The dual-type encapsulating materials include YSL-300F and YSL-350F as methyl-based silicone resin encapsulating materials manufactured by Yokohama Rubber Co. Ltd., and YSH-600F and YSH-650F as phenyl-based silicone resins manufactured by the same company and the like.

Of the encapsulating material (i), as the polycondensation-type encapsulating material, an encapsulating material comprising a resin X having a dialkylsiloxane structure represented by the formula (1) is preferable.

Of the resin X, a polydialkylsiloxane resin Y1 having silanol groups at both the ends is more preferable.

Further, a resin composition Y2 which is a mixture of the resin Y1 and an organic silicone compound monomer represented by the formula (3), or a resin composition Y3 which is a mixture of the resin Y1 and an oligomer produced by dealcoholization or hydrolytic condensation between the terminal silanol groups in the resin Y1 and the monomer represented by the formula (3) is mentioned.

Furthermore, a modified polysiloxane resin Y4 produced by condensation reaction between the terminal silanol groups in the resin Y1 and the monomer represented by the formula (3), or a modified polysiloxane resin Y5 produced by condensation reaction between the terminal silanol groups in the resin Y1 and an oligomer produced by dealcoholization or hydrolytic condensation of the monomer represented by the formula (3) is mentioned.

$$R^4_{(4-m)}Si(R^5)_m \quad (3)$$

(In the formula (3), $R^4$ represents an alkyl group, $R^5$ represents an alkoxy group, a hydroxyl group or a halogen atom, and m represents a positive number of 1 to 4.)

The alkyl group represented by $R^4$ may be linear or branched, or may have a cyclic structure. A linear or branched alkyl group is preferable, and a linear alkyl group is more preferable. Although the number of carbon atoms in the alkyl group is not limited, 1 to 10 is preferable, 1 to 6 is more preferable, and 1 to 3 is further preferable.

When $R^5$ is an alkoxy group, the alkoxy group may be linear or branched, or may have a cyclic structure, a linear or branched alkoxy group is preferable, and a linear alkoxy group is more preferable. Although the number of carbon atoms in the alkoxy group is not limited, 1 to 4 is preferable.

In the resin X described by formula (1), n is preferably in the range of 5 to 3000, more preferably in the range of 5 to 1500, further preferably in the range of 5 to 1000, particularly preferably in the range of 5 to 800, and especially preferably in the range of 5 to 500. When n satisfies the said ranges, the stress relaxation resistance and gas barrier property are excellent.

The polydialkylsiloxane resin Y1 having silanol groups at both ends include DMS-S12, DMS-S14, DMS-S15, DMS-S21, DMS-S27, DMS-S31, DMS-S32, DMS-S33, DMS-S35, DMS-S42, DMS-S45 and DMS-S51 manufactured by Gelest Inc., X-21-5841 and KF-9701 manufactured by Shin-Etsu Chemical Co. Ltd., and FINISH WA 62 M, CT 601 M, CT 5000 M and CT 6000 M manufactured by Asahi Kasei Wacker Silicone Co. and the like.

Specific examples of the monomer represented by the formula (3) include trimethylmethoxysilane, trimethylethoxysilane, trimethylisopropoxysilane, trimethyl silanol, trimethylchlorosilane, triethylmethoxysilane, triethylethoxysilane, triethylisopropoxysilane, triethyl silanol and triethylchlorosilane as compounds in which m is 1, dimethyldimethoxysilane, dimethyldiethoxysilane, dimethyldiisopropoxysilane, dimethyldichlorosilane, diethyldimethoxysilane, diethyldiethoxysilane, diethyldiisopropoxysilane, diethyldichlorosilane, diisopropyldimethoxysilane, diisopropyldiethoxysilane, diisopropyldiisopropoxysilane and diisopropyldichlorosilane as compounds in which m is 2, methyltrimethoxysilane, methyltriethoxysilane, methyl triisopropoxysilane, methyltrichlorosilane, ethyltrimethoxysilane, ethyltriethoxysilane, ethyltriisopropoxysilane and ethyltrichlorosilane as compounds in which m is 3, and tetramethoxysilane, tetraethoxysilane, tetraisopropoxysilane and tetrachlorosilane as compounds in which m is 4, respectively.

The oligomer produced by dealcoholization or hydrolytic condensation of the monomer represented by the formula (3) includes, for example, a condensate having a molecular weight of 2000 or less which is produced by dealcoholization reaction or dehydration condensation reaction or both of them in the absence of a solvent or in an organic solvent, in addition of water if necessary, and in the presence of an acid, an alkali or a metal catalyst.

The modified polysiloxane resin Y4 or Y5, which is produced by the condensation between the resin Y1 having silanol groups at both the ends and the monomer represented by the formula (3) or the oligomer produced by dealcoholization or hydrolytic condensation thereof, can also be produced by dealcoholization reaction or dehydration condensation reaction or both of them in the absence of a solvent or in an organic solvent, in addition of water if necessary, and in the presence of an acid, an alkali or metal catalyst.

As the acid, for example, inorganic acids such as hydrochloric acid, sulfuric acid, nitric acid and phosphoric acid or organic acids such as formic acid, acetic acid, oxalic acid, citric acid, propionic acid, butyric acid, lactic acid and succinic acid can be used. As the alkali, ammonium hydroxide, tetramethylammonium hydroxide, tetraethylammonium hydroxide and the like can be used. As the metal catalyst, metal alkoxides such as aluminum isopropoxide and zirconium isopropoxide, metal acetylacetonates such as zirconium acetylacetonate, zinc octoate, zinc benzoate, p-tert-butyl benzoate, zinc laurate, zinc stearate, tin octoate and the like can be used.

These acids can also be used in the third step described later when the resin Y1, the resin compositions Y2 and Y3, and the modified polysiloxane resins Y4 and Y5 are used as the encapsulating material (i).

<Polycondensation-Type Encapsulating Material (ii)>

As the polycondensation-type encapsulating material (ii), an encapsulating material comprising a resin A having an organopolysiloxane structure represented by the formula (2) is preferable.

It is further preferable that the polycondensation-type encapsulating material (ii) further comprises an oligomer B having an organopolysiloxane structure represented by the formula (4) and the mixing ratio of the resin A and the oligomer B is Resin A: Oligomer B=100:0.1 to 20 (mass ratio). By means of making the resin A as the main component, the resistance against the heat generated by the light emission of the light-emitting element can be improved, and the deterioration of the encapsulating material by the ultraviolet light emitted from the ultraviolet LED can be suppressed.

(4)

(In the formula (4), $R^1$ and $R^2$ represent the same meaning as the formula (2), and $p^2$, $q^2$, $r^2$, $a$ and $b^2$ represent the number of 0 or more than 0 satisfying $[a^2 \times q^2]/[(p^2+b^2 \times q^2)+a^2 \times q^2+(r^2+q^2)]=0$ to 0.3.)

The alkyl group represented by $R^3$ may be linear or branched, or may have a cyclic structure. A linear or branched alkyl group is preferable, and a linear alkyl group is more preferable. Although the number of carbon atoms in the alkyl group is not limited, 1 to 10 is preferable, 1 to 6 is more preferable, and 1 to 3 is more preferable.

$R^2$ each independently represent an alkoxy group or a hydroxyl group.

When $R^2$ is an alkoxy group, the alkoxy group may be linear or branched, or may have a cyclic structure. A linear or branched alkoxy group is preferable, and a linear alkoxy group is more preferable. Although the number of carbon atoms of the alkoxy group is not limited, 1 to 4 is preferable.

The plurality of $R^1$ and $R^2$ may each be a group of the same type or groups different from each other.

The resin A is preferably a resin having one or more groups selected from the group consisting of a methyl group and an ethyl group as $R^1$ and having one or more groups selected from the group consisting of a methoxy group, an ethoxy group, an isopropoxy group and a hydroxyl group as $R^2$, and more preferably a resin having one or more groups selected from the group consisting of a methyl group and an ethyl group as $R^1$ and having one or more groups selected from the group consisting of a methoxy group, an ethoxy group and an isopropoxy group, and a hydroxyl group as $R^2$.

The weight average molecular weight (Mw) of the resin A is usually not 1500 to 8000. When the weight average molecular weight of the resin A is within the range, the polycondensation-type encapsulating material (ii) with excellent gas barrier property is produced. The weight average molecular weight of the resin A is preferably 1500 to 7000, and more preferably 2000 to 5000.

The Resin A, for example, can be synthesized from an organic silicon compound corresponding to each of the above-described repeating units and having a functional group capable of forming a siloxane bond as the starting material.

"Functional group capable of forming a siloxane bond" includes, for example, a halogen atom, a hydroxyl group and an alkoxy group. As the organic silicon compound, for example, organotrihalosilane, organotrialkoxysilane and the like can be used as a starting material. The Resin A, for example, can be synthesized by the hydrolytic condensation reaction of these starting materials in the ratios corresponding to the presence of each repeating unit. As the Resin A, resins which are industrially commercially available as a silicone resin, an alkoxy oligomer and the like can be used.

The oligomer B is preferably an oligomer having one or more groups selected from the group consisting of a methyl group and an ethyl group as $R^1$ and having one or more groups selected from the group consisting of a methoxy group, an ethoxy group, an isopropoxy group and a hydroxyl group as $R^2$, and more preferably an oligomer having one or more groups selected from the group consisting of a methyl group and an ethyl group as $R^1$ and having one or more groups selected from the group consisting of a methoxy group, an ethoxy group and an isopropoxy group as $R^2$.

The weight average molecular weight of the oligomer B is usually less than 1500. When the weight average molecular weight of the oligomer B is within the said range, the crack resistance of the polycondensation-type encapsulating material (ii) after curing is better. The weight average molecular weight of the oligomer B is preferably 200 or more to less than 1500, and more preferably 250 to 1000.

The Oligomer B, for example, can be synthesized from an organic silicon compound corresponding to each of the above-described repeating units constituting the oligomer B and having a functional group capable of forming a siloxane bond as the starting material. "Functional group capable of forming a siloxane bond" represents the same meaning as described above. As the organic silicon compound, organotrihalosilane, organotrialkoxysilane and the like can be used as the starting materials. The silicone resin can be synthesized by the hydrolytic condensation reaction of these starting materials in the ratios corresponding to the presence of each repeating unit.

The difference of the weight average molecular weight between the oligomer B and the resin A, for example, can be controlled by controlling the reaction temperature during the hydrolytic condensation of the starting materials, the addition speed of the starting materials into the reaction system and the like. As the oligomer B, resins which are industrially commercially available as a silicone resin, an alkoxy oligomers and the like can be used.

The weight average molecular weight of the resin A and oligomer B can be measured by using a commercially available GPC apparatus and by using polystyrene as standards.

The polycondensation-type encapsulating material (ii) preferably further comprises a curing catalyst. When the curing catalyst is used, the resin A and oligomer B were prepared as separate solutions, and it is preferable to mix the solutions before using them.

As the curing catalyst, for example, inorganic acids such as hydrochloric acid, sulfuric acid, nitric acid and phosphoric acid or organic acids such as formic acid, acetic acid, oxalic acid, citric acid, propionic acid, butyric acid, lactic acid and succinic acid can be used. It is possible to use not only an acidic compound but also an alkaline compound as the curing catalysts. As the alkaline compound, specifically, ammonium hydroxide, tetramethylammonium hydroxide, tetraethylammonium hydroxide and the like can be used. Besides these, as the curing catalysts, metal alkoxides such as aluminum isopropoxide and zirconium isopropoxide and metal acetylacetonates such as zirconium acetylacetonate can be used.

The encapsulating material (i) before curing and the polycondensation-type (ii) before curing may be dissolved in a solvent, and then used in order to pot them in the second step and the fourth step described later, respectively.

The solvent only needs to dissolve each of the encapsulating materials (i) or (ii) before curing to be used. The solvent includes, for example, ketone solvents such as acetone and methyl ethyl ketone; alcohol solvents such as methanol, ethanol, isopropyl alcohol and N-propyl alcohol; hydrocarbon solvents such as hexane, cyclohexane, heptane and benzene; acetic acid ester solvents such as methyl acetate and ethyl acetate; an ether solvent such as tetrahydrofuran; glycol ethers such as ethyleneglycol monomethyl ether, ethyleneglycol monoethyl ether, ethyleneglycol monoisopropyl ether, ethyleneglycol monobutyl ether, ethyleneglycol monohexyl ether, ethyleneglycol monoethylhexyl ether, ethyleneglycol monophenyl ether, ethyleneglycol monobenzyl ether, diethyleneglycol monomethyl ether, diethyleneglycol monoethyl ether, diethyleneglycol monoisopropyl ether, diethyleneglycol monobutyl ether, diethyleneglycol monohexyl ether, diethyleneglycol monoethylhexyl ether, diethyleneglycol monophenyl ether, diethyleneglycol monobenzyl ether, propyleneglycol monomethyl ether, propyleneglycol monoethyl ether, propyleneglycol monoisopropyl ether, propyleneglycol monobutyl ether, propyleneglycol monohexyl ether, propyleneglycol monoethylhexyl ether, propyleneglycol monophenyl ether, propyleneglycol monobenzyl ether, dipropyleneglycol monomethyl ether, dipropyleneglycol monoethyl ether, dipropyleneglycol monoisopropyl ether, dipropyleneglycol monobutyl ether, dipropyleneglycol monohexyl ether, dipropyleneglycol monoethylhexyl ether, dipropyleneglycol monophenyl ether and dipropyleneglycol monobenzyl ether solvent; glycol esters solvent obtained by adding an acetic acid group to the glycol ether solvent such as ethyleneglycol monoethyl ether acetate, ethyleneglycol monoisopropyl ether acetate, ethyleneglycol monobutyl ether acetate, ethyleneglycol monohexyl ether acetate, ethyleneglycol monomethylethylhexyl ether acetate, ethyleneglycol monophenyl ether acetate and ethyleneglycol monobenzyl ether acetate.

Among these solvents, for the purpose of encapsulating the element that emits light in the ultraviolet region (in particular UV-C region), a solvent having an ester bond and/or an ether bond, having no hydroxy group, and having a boiling point of 100° C. to 200° C. under 1 atmosphere, and 130° C. to 200° C. is preferable. When the boiling point is 100° C. or more, preferably 130° C. or more, it is difficult for the solvent to be evaporated during the operation of weighing, mixing, potting and the like, and the operability tends to be better, and when the boiling point is 200° C. or less, it is difficult for the solvent to remain after curing, and it is easy to transmit the light of the short-wavelength region of 350 nm or less of an ultraviolet LED and the like, that is preferable.

Suitable solvents for the purpose of encapsulating the element that emits light in the ultraviolet region (in particular UV-C region), specifically, are ester solvents such as butyl acetate and butyl butyrate; an ether solvent such as dioxane; glycol ether solvents such as ethyleneglycol diethyl ether and diethyleneglycol diethyl ether, glycol ester solvents such as 2-ethoxyethyl acetate and 2-butoxyethyl acetate; and the like.

Further, in order to suppress the crack resistance of the encapsulating material after curing, solvents having a hydroxy group, having a boiling point of 100° C. or more under 1 atmosphere and having a melting point of 25° C. or less are preferable.

Preferable solvents for the purpose of suppressing the crack resistance of the encapsulating material after curing include, specifically, alcohol solvents such as butanol, hexanol and octanol; glycol solvents such as diethyleneglycol monoethyl ether; and the like.

<Method for Producing a Semiconductor Light-Emitting Device>

The producing method of the present invention comprises a first step of providing the substrate with the element; a second step of potting at least one encapsulating material (i) before curing selected from the group consisting of addition polymerization-type encapsulating materials and polycondensation-type encapsulating materials onto the substrate to cover the element;

a third step of curing the potted encapsulating material (i) before curing; and a fourth step of potting a polycondensation-type encapsulating material (ii) before curing onto the encapsulating material (i) after curing which covers the element, and then curing the potted polycondensation-type encapsulating material (ii) before curing, thereby laminating the encapsulating material.

As a second embodiment in which the encapsulating material (i) is an addition polymerization-type encapsulating material, the producing method of the present invention comprises a first step of providing the substrate with the element; a second step of potting an addition polymerization-type encapsulating material before curing onto the substrate to cover the element;

a third step of curing the potted addition polymerization-type encapsulating material before curing; and a fourth step of potting an polycondensation-type encapsulating material before curing onto the addition polymerization-type encapsulating material after curing which covers the element, and then curing the potted polycondensation-type encapsulating material before curing, thereby laminating the encapsulating material.

In this second embodiment, by laminating the polycondensation-type encapsulating material onto the addition polymerization-type encapsulating material after curing in the second and third steps, the effects of suppression of luminance reduction of the light-emitting device, improvement of the gas barrier property and prevention of scratches from the outside can be obtained.

Further, as a third embodiment in which the encapsulating material (i) is a polycondensation-type encapsulating material (i), the producing method of the present invention comprises a first step of providing the substrate with the element; a second step of potting an polycondensation-type encapsulating material (i) before curing onto the substrate to cover the element;

a third step of curing the potted polycondensation-type encapsulating material (i) before curing; and a fourth step of potting an polycondensation-type encapsulating material (ii) before curing onto the polycondensation-type encapsulating material (i) after curing which covers the element, and then curing the potted polycondensation-type encapsulating material (ii) after curing, thereby laminating the encapsulating material.

In this third embodiment, by encapsulating the polycondensation-type encapsulating material (i) in the second step and encapsulating the polycondensation-type encapsulating material (ii) in the fourth step, the effects of the suppression of encapsulating material degradation and luminance reduction of the light-emitting device, prevention of scratches from the outside and further improvement of the thermal shock resistance can be obtained.

Hereinafter, each step will be described.

The first step is a step of providing the above-mentioned substrate with the above-mentioned element by conventional manner. Other configurations typically required for a semiconductor light-emitting device such as electrodes and wiring can be placed.

The second step is a step of potting the encapsulating material (i) before curing to cover the element placed on the substrate.

The potting step is usually performed by supplying the encapsulating material before curing onto the substrate by dedicated dispenser. Since there are various shapes of the semiconductor light-emitting device and the element according to the intended use of the device, the amount of encapsulating material supplied is different according to the structures such as the substrate and the element, area, volume, the structures such as other electrodes and wire wiring, and the like, and it is preferable that the amount is an amount which can make the thickness of the encapsulating material embedding these elements, wire wiring and the like and covering the light-emitting element as thin as possible, and it is more preferable that the amount is an amount which can make the thickness 6 of the encapsulating material (i) in the FIG. 1 and FIG. 2 a thickness of 1 mm or less.

The third step is a step of curing the potted encapsulating material (i) before curing in the second step.

When the encapsulating material (i) is an addition polymerization-type encapsulating material, the curing conditions can be set to the usual temperature and time at which the addition polymerization reaction occurs, and specifically, the condition under atmospheric pressure, in the air and in a temperature of 80 to 200° C. is preferable, and the condition in a temperature of 100 to 150° C. is more preferable. The time is preferably 1 to 5 hours. In order to effectively accelerate the evaporation of the residual solvent in the resin, the addition polymerization reaction and the like, the curing can be done by raising the curing temperature step-wise.

When the encapsulating material (i) is a polycondensation-type encapsulating material, the curing conditions can be set to the usual temperature and time at which the polycondensation reaction occurs, and specifically, the condition under atmospheric pressure, in the air and in a temperature of 80 to 250° C. is preferable, and the condition in a temperature of 100 to 200° C. is more preferable. The time is preferably 1 to 5 hours. In order to effectively accelerate the evaporation of the residual solvent in the resin, the polycondensation reaction and the like, the curing can be done by raising the curing temperature step-wise.

The fourth step is a step of potting a polycondensation-type encapsulating material (ii) before curing onto the encapsulating material (i) after curing in the third step, and then curing the potted polycondensation-type encapsulating material (ii) before curing, thereby laminating the encapsulating material.

The polycondensation-type encapsulating material (ii) to be potted in the fourth step can also be supplied onto the encapsulating material (i) after curing in the third step by using a conventional dispenser. When the amount of the encapsulating material (i) supplied in the second step is W1 [g] and the amount of the polycondensation-type encapsulating material (ii) supplied in the fourth step is W2 [g], the supply can be set in such a manner that the ratio of W2/W1 is usually 0.5 to 13, preferably 1.5 to 8 when the encapsulating material (i) is an addition polymerization-type encapsulating material, and the supply can be set in such a manner that the ratio of W2/W1 is usually 0.5 to 15, preferably 1.5 to 13 when the encapsulated encapsulating material (i) is a polycondensation-type encapsulating material. Although there is a case that a resin is dissolved in a solvent depending on the kind of the encapsulating material, the supplies of W1 [g] and W2 [g] are the amounts obtained by subtracting the amount of the solvent contained in the encapsulating material.

When this ratio satisfies this range, the shape of the encapsulating material covering the element is stabilized, and as a result, the luminance of the light-emitting device is stabilized.

The curing condition in the fourth step after covering the surface of the encapsulating material (i) after curing in the third step by supplying the polycondensation-type encapsulating material (ii) before curing is, when the curing temperature in the third step is T [° C.] and the curing temperature in the fourth step is $T_a$ [° C.], preferably the range of $T_a-25<T_b\leq T_a+150$, and further, more preferably the range of $T_a-10<T_b\geq T_a+100$. Curing in this range can prevent diffused reflection or loss of light emitted from the element due to poor adhesion or cracking, therefore the luminance of the light-emitting device is stabilized. The curing time at temperature $T_b$ is preferably the range of 1 to 5 hours. It is also possible to raise the temperature step-wise until the curing temperature $T_b$.

The fourth step is preferably a step of laminating a polycondensation-type encapsulating material (ii) which has a physical property different from that of the encapsulating material (i) after curing obtained in the third step. Such a physical property is more preferably a property that stress applied to the polycondensation-type encapsulating material (ii) after curing laminated in the fourth step is relaxed by the encapsulating material (i) after curing obtained in the third step. Further, the encapsulating material (i) after curing obtained in the third step contacts the element and the substrate directly, and it accumulates the stress of expansion or contraction caused by the difference in material due to heat generated by the light-emitting element and the external temperature change, therefore it is preferable that the encapsulating material (i) after curing obtained in the third step has a higher stress relaxation resistance than the polycondensation-type encapsulating material (ii) after curing laminated in the fourth step.

As the index representing such properties, the resin hardness after curing is effective, inter alia, it is preferable to combine the encapsulating material (i) after curing in the third step with a cured resin hardness Shore hardness A represented by 90 to 20 and the polycondensation-type encapsulating material (ii) after curing in the fourth step with a Shore hardness D represented by 90 to 20, and it is more preferable to combine the encapsulating material (i) after curing in the third step with a Shore hardness A represented by 60 to 20 and the polycondensation-type encapsulating material (ii) after cuing in the fourth step with a Shore hardness D represented by 90 to 60.

By repeating the fourth step, a semiconductor light-emitting device in which three or more layers each comprising the encapsulating material are laminated can be produced. The semiconductor light-emitting device of the present invention is preferably a semiconductor light-emitting device in which two or more layers each comprising the encapsulating material are laminated, and more preferably a semiconductor light-emitting device in which three or more layers each comprising the encapsulating material are laminated from the viewpoint of the barrier properties against water, oxygen and the like.

Further, the semiconductor light-emitting device of the present invention is preferably an ultraviolet LED.

EXAMPLES

[Producing Example 1] <Preparation of Polycondensation-Type Encapsulating Material (i)>

3 g of silanol terminated polydimethyl siloxane resin DMS-S 21 manufactured by Gelest, Inc. (Mw=8200) was added to a plastic container, and then a mixture of methyltriethoxysilane 490 mg manufactured by Wako Pure Chemical Industries Ltd. and 10 mg of aluminum isopropoxide manufactured by Wako Pure Chemical Industries Ltd. were added thereto and stirred well, thereby preparing a polycondensation-type encapsulating material (i). The hardness of the encapsulating material (i) after curing at 200° C. for 3 hours was Shore hardness A35.

[Producing Example 2] <Preparation of Polycondensation-Type Encapsulating Material (ii)>

76 g of resin A having an organopolysiloxane structure represented by the formula (2) (Mw=3500, $R^1$=methyl, $R^2$=methoxy group or a hydroxyl group, with the proportions of the repeating units shown in Table 1) and 24 g of 2-butoxyethyl acetate were added to a plastic container capable of sealing, and they were heated at 80° C. for 1 hour by using a hot water bath while they were stirred by using a stirrer. To 10 g of the resultant resin solution, 0.2 g of a mixture of 15% by weight of phosphoric acid and 85% by weight of terminal silanol dimethylsiloxane comprising 3 to 7 units of the alkoxysilane as the main component was added, degassed and mixed, thereby preparing a polycondensation-type encapsulating material (ii). The hardness of the encapsulating material (ii) after curing at 200° C. for 3 hours was Shore hardness D75.

TABLE 1

| Repeating units |  |  |  |
|---|---|---|---|
| Presence ratio | 0.08 | 0.15 | 0.77 |

[Example 1] <Use of Addition Polymerization-Type Encapsulating Material as the Encapsulating Material (i)>

5.0 g each of the solution A and solution B (both being solvent-free solutions) of an addition polymerization-type encapsulating material OE-6351 manufactured by Dow Corning Toray Co. Ltd., were degassed and mixed in a plastic container, thereby preparing an encapsulating material solution. 2.7 mg of the resultant encapsulating material solution was added drop-wise by dispenser in the center of the LTCC substrate (3.5×3.5 mm) on which the element emitting light of the wavelength of 275 nm was placed in advance, and then the encapsulating material was cured by holding at 40° C. for 10 minutes and at 150° C. for 1 hour, thereby obtaining the cured addition polycondensation-type encapsulating material.

Then, after filling the dispenser with the polycondensation-type encapsulating material (ii) obtained in Producing Example 2, 14.7 mg thereof was added drop-wise so as to cover the surface of the cured addition polymerization-type encapsulating material described above. The supply of the addition polymerization-type encapsulating material is W1 (=2.7 mg) and the supply of the polycondensation-type encapsulating material is W2 (=14.7×0.76=11.17 mg), therefore the ratio of W2/W1 is 4.1. Then, three encapsulating film samples each having a two-layers structure were fabricated by curing the polycondensation-type encapsulating material through holding at 40° C. for 10 minutes and at 200° C. for 3 hours. The thickness of the resultant film was 1.17 mm (the thickness of the lower layer of the film: 0.29 mm, the thickness of the upper layer of the film: 0.88 mm). The resultant sample was placed in a compact thermal shock apparatus manufactured by Espec Co. Ltd., (trade name "TSE-11"). The resultant sample was tested for 1000 cycles in which the cycle was composed of holding at −40° C. for 30 minutes, then at 100° C. for 30 minutes, again at −40° C. for 30 minutes ("−40° C.×30 minutes, 100° C.×30 minutes" is one cycle). The frequency of crack occurrence was observed by using a microscope, and crack and peeling did not occur in each of three samples.

Example 2 <Use of Polycondensation-Type Encapsulating Material as the Encapsulating Material (i)>

The polycondensation-type encapsulating material (i) obtained in Producing Example 1 was added drop-wise in the center of the LTCC substrate (3.5×3.5 mm) on which the element emitting light of the wavelength of 275 nm was placed in advance so as to have a thickness of 1 mm or less. Then, the substrate was put into an oven at 25° C., and the temperature was raised to 200° C. over 2 hours, and after reaching 200° C., it was allowed to stand for three hours, thereby curing the polycondensation-type encapsulating material (i).

Then, the substrate was taken out from the oven, and the polycondensation-type encapsulating material (ii) obtained in Producing Example 2 was added drop-wise so that the entire thickness becomes 2 mm or less.

Then, the substrate was put into an oven at 25° C., and the temperature was raised to 200° C. over 2 hours, and after reaching 200° C., it was allowed to stand for 3 hours, thereby obtaining a sample by curing the polycondensation-type encapsulating material (ii).

The resultant sample was placed in a compact thermal shock apparatus manufactured by Espec Co. Ltd., (trade name "TSE-11"). The resultant sample was tested for 1000 cycles in which the cycle was composed of holding at −40° C. for 30 minutes, then at 100° C. for 30 minutes, again at −40° C. for 30 minutes ("−40° C.×30 minutes, 100° C.×30 minutes" is one cycle). The frequency of crack occurrence was observed by using a microscope, and crack and peeling did not occur.

Comparative Example 1

12.7 g of methyl trimethoxysilane, 11.2 g of dimethyldimethoxysilane, 3.3 g of methanol, 8.1 g of water and 4.8 g of 5 wt % acetylacetone aluminum salt methanol solution as the catalyst were added and mixed in a container capable of sealing, and they were sealed hermetically, and after heating at 50° C. for 8 hours by using a hot water bath while they were stirred by using a stirrer, they were cooled to room temperature, thereby preparing a solution of hydrolysis and polycondensation.

14.0 mg in the total amount of the solution of hydrolysis and polycondensation was divided into 5 or 6 times by using a micropipette, and it was added drop-wise in the center of the LTCC substrate. Then, after the first drying of holding at 35° C. for 30 minutes and then at 50° C. for 1 hour, and performing the second drying of holding at 150° C. for 3 hours, three encapsulating material samples with a thickness of 1.17 mm were fabricated. The heat cycle test for the resultant encapsulating film samples was done by using the compact thermal shock apparatus in the same manner as in Example 1, and peeling had occurred in all the samples.

INDUSTRIAL APPLICABILITY

According to the producing method of the present invention, a semiconductor light-emitting device which is excellent in thermal shock resistance can be produced.

DESCRIPTION OF REFERENCE SIGNS

1 Encapsulating material (i) after curing in the third step
2 Polycondensation-type encapsulating material (ii) after curing in the fourth step
3 Substrate
4 Element
5 Electrode
6 Thickness of the encapsulating material (i) after curing in the third step
7 Thickness of the polycondensation-type encapsulating material (ii) after curing in the fourth step
8 Wire

The invention claimed is:

1. A method for producing a semiconductor light-emitting device comprising a substrate, an element and a laminated encapsulating material as constituent members, comprising
a first step of providing the substrate with the element;
a second step of potting at least one encapsulating material (i) selected from the group consisting of an addition polymerization-type encapsulating material and a first polycondensation-type encapsulating material onto the substrate to cover the element;
a third step of curing the potted encapsulating material (i); and
a fourth step of potting a second polycondensation-type encapsulating material (ii) onto the cured encapsulating material (i) which covers the element, and then curing the potted second polycondensation-type encapsulating material (ii), thereby forming the laminated encapsulating material,
wherein an amount of the at least one encapsulating material (i) supplied in the second step is represented by W1 [g] and an amount of the second polycondensation-type encapsulating material (ii) supplied in the fourth step is represented by W2 [g], the ratio W2/W1 is 1.5 to 8 if the at least one encapsulating material (i) is the addition polymerization-type encapsulating material, or the ratio W2/W1 is 1.5 to 13 if the at least one encapsulated encapsulating material (i) is the first polycondensation-type encapsulating material.

2. The producing method according to claim 1, wherein the encapsulating material (i) is an addition polymerization-type encapsulating material.

3. The producing method according to claim 1, wherein the encapsulating material (i) is the first polycondensation-type encapsulating material.

4. The producing method according to claim 3, wherein the first polycondensation-type encapsulating material used in the second step comprises a resin X having a dialkyl siloxane structure represented by the formula (1):

in the formula (1), $R^3$ each independently represents an alkyl group, and n represents an integer of 5 to 4000.

5. The producing method according to claim 4, wherein n is an integer of 5 to 1000.

6. The producing method according to claim 1, wherein the second polycondensation-type encapsulating material (ii) used in the fourth step comprises a resin A having an organopolysiloxane structure represented by the formula (2):

(2)

in the formula (2), $R^1$ each independently represents an alkyl group, $R^2$ each independently represents an alkoxy group or a hydroxyl group, and $p^1$, $q^1$, $a^1$ and $b^1$ represent positive numbers satisfying $[p^1+b^1 \times q^1]:[a^1 \times q^1]=1:0.25$ to $9$.

7. The producing method according to claim 1, wherein the fourth step is a step of obtaining a cured polycondensation-type encapsulating material (ii) which has a physical property different from that of the cured encapsulating material (i) obtained in the third step.

8. The producing method according to claim 7, wherein the physical property is a physical property that stress applied to the cured polycondensation-type encapsulating material (ii) obtained in the fourth step is relaxed by the cured encapsulating material (i) obtained in the third step.

9. The producing method according to claim 8, wherein the cured encapsulating material (i) obtained in the third step has a higher stress relaxation property than the cured second polycondensation-type encapsulating material (ii) obtained in the fourth step.

10. The producing method according to claim 1, wherein the cured encapsulating material (i) obtained in the third step has adhesion with the cured second polycondensation-type encapsulating material (ii) obtained in the fourth step.

11. The producing method according to claim 1, wherein the semiconductor light-emitting device is an ultraviolet LED.

12. The producing method according to claim 1, characterized by repeating the fourth step, thereby producing a semiconductor light-emitting device in which three or more layers each comprising the encapsulating material are laminated.

13. A semiconductor light-emitting device produced by the producing method according to claim 1, wherein two or more layers each comprising the encapsulating material are laminated.

* * * * *